(12) United States Patent
Sun

(10) Patent No.: US 7,871,907 B2
(45) Date of Patent: Jan. 18, 2011

(54) MASK AND METHOD OF FABRICATING A POLYSILICON LAYER USING THE SAME

(75) Inventor: Ming-Wei Sun, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 303 days.

(21) Appl. No.: 12/235,555

(22) Filed: Sep. 22, 2008

(65) Prior Publication Data
US 2010/0009523 A1    Jan. 14, 2010

(30) Foreign Application Priority Data
Jul. 9, 2008    (TW) .............................. 97125978 A

(51) Int. Cl.
*H01L 21/20*    (2006.01)
(52) U.S. Cl. .................. 438/487; 438/486; 438/48; 438/128; 438/149; 438/151; 438/166; 438/795; 257/E21.134; 257/72; 257/59; 257/347; 257/350; 257/66; 257/E33.053; 257/E27.059; 257/E29.002; 430/5
(58) Field of Classification Search ......... 438/486–487, 438/48, 128, 149, 151, 166, 795; 257/E21.134, 257/72, 59, 347, 350, 66, E33.053, E27.059, 257/E29.002; 430/5
See application file for complete search history.

(56) References Cited

U.S. PATENT DOCUMENTS

| | | | |
|---|---|---|---|
| 6,177,301 B1 | 1/2001 | Jung | |
| 6,326,286 B1 * | 12/2001 | Park et al. | 438/478 |
| 6,590,228 B2 | 7/2003 | Voutsas et al. | |
| 6,607,971 B1 | 8/2003 | Moriguchi et al. | |
| 6,736,895 B2 | 5/2004 | Jung | |
| 6,908,835 B2 | 6/2005 | Sposili et al. | |
| 7,018,750 B2 | 3/2006 | Hwang | |
| 7,046,715 B2 * | 5/2006 | Voutsas et al. | 372/109 |
| 7,193,240 B2 | 3/2007 | Jung | |
| 7,329,936 B2 * | 2/2008 | Jung | 257/435 |
| 7,473,498 B2 * | 1/2009 | Sun | 430/5 |
| 2002/0130324 A1 * | 9/2002 | Song et al. | 257/72 |

(Continued)

FOREIGN PATENT DOCUMENTS

TW    I271792    1/2007

(Continued)

OTHER PUBLICATIONS

"Office Action of Taiwan Counterpart Application" issued on Apr. 12, 2010, p. 1-p. 4.

*Primary Examiner*—Fernando L Toledo
*Assistant Examiner*—Ankush k Singal
(74) *Attorney, Agent, or Firm*—Jianq Chyun IP Office

(57) ABSTRACT

A mask includes a primary opaque pattern and a number of clusters of secondary opaque patterns. The primary opaque pattern defines a number of strip transparent slits whose extending directions are substantially the same. The clusters of the secondary opaque patterns are connected to the primary opaque pattern, and each of the clusters of the secondary opaque patterns is disposed in one of the transparent slits, respectively. Each of the clusters of the secondary opaque patterns includes a number of secondary opaque patterns, and extending directions of at least a portion of the secondary opaque patterns and the extending directions of the transparent slits together form included angles that are not equal to about 90°.

13 Claims, 10 Drawing Sheets

U.S. PATENT DOCUMENTS

| | | |
|---|---|---|
| 2002/0179004 A1 | 12/2002 | Jung |
| 2003/0043321 A1* | 3/2003 | Chien et al. .................. 349/113 |
| 2003/0096489 A1* | 5/2003 | Im et al. ..................... 438/487 |
| 2004/0053450 A1* | 3/2004 | Sposili et al. ............... 438/151 |
| 2004/0106241 A1* | 6/2004 | Kim et al. ................... 438/166 |
| 2004/0259296 A1* | 12/2004 | Voutsas et al. .............. 438/166 |
| 2005/0034653 A1* | 2/2005 | Im et al. ....................... 117/84 |
| 2005/0079693 A1 | 4/2005 | Kang et al. |
| 2007/0032050 A1* | 2/2007 | Chung et al. ................. 438/487 |
| 2007/0184638 A1* | 8/2007 | Kang et al. .................. 438/487 |
| 2007/0202668 A1* | 8/2007 | Im et al. ..................... 438/487 |
| 2007/0264806 A1 | 11/2007 | Park |
| 2008/0045042 A1* | 2/2008 | Chu et al. .................... 438/799 |

FOREIGN PATENT DOCUMENTS

| | | |
|---|---|---|
| TW | I274956 | 3/2007 |

* cited by examiner

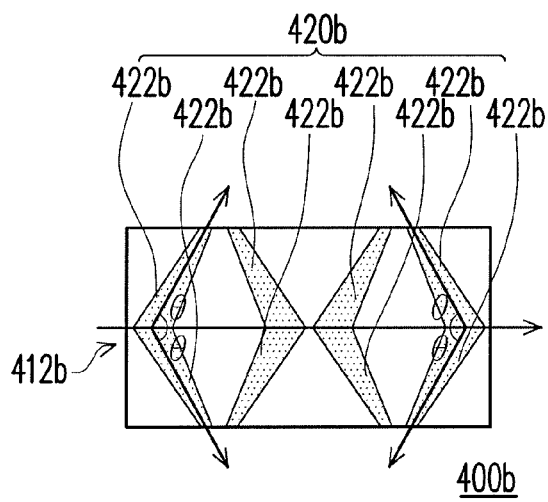
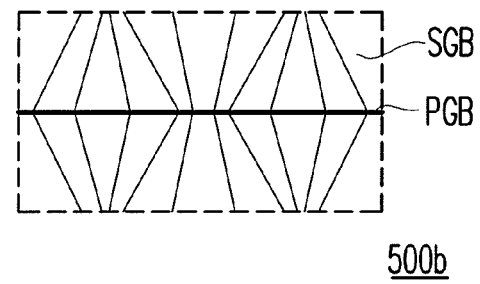
FIG. 6A    FIG. 6B
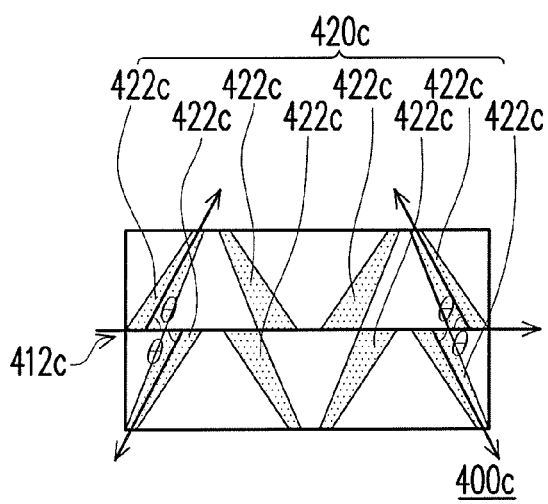
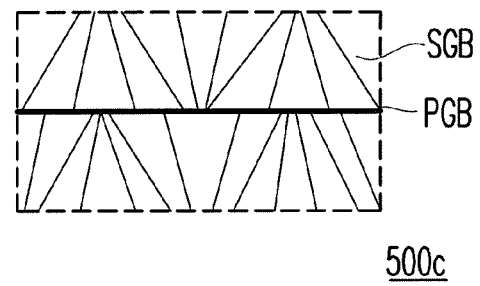
FIG. 7A    FIG. 7B

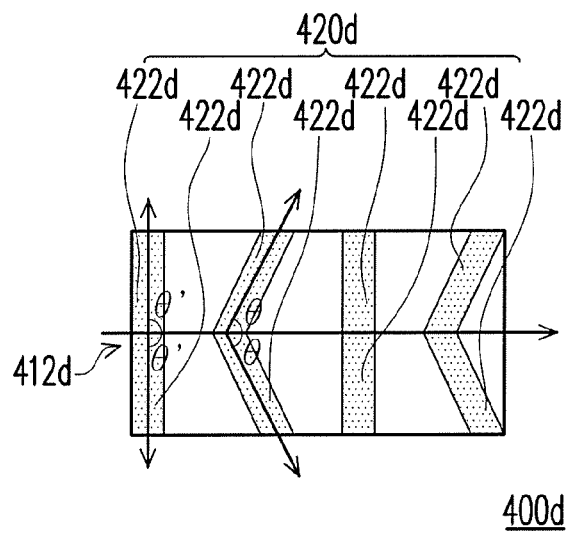
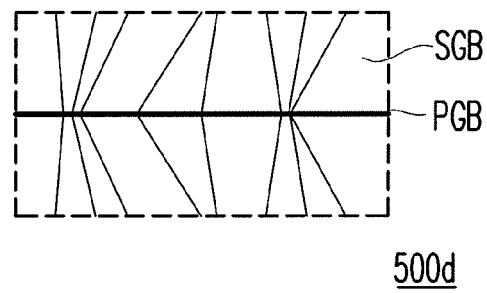
FIG. 8A          FIG. 8B
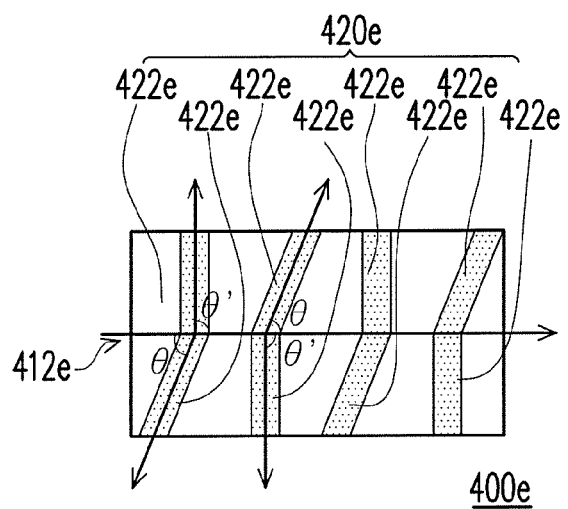
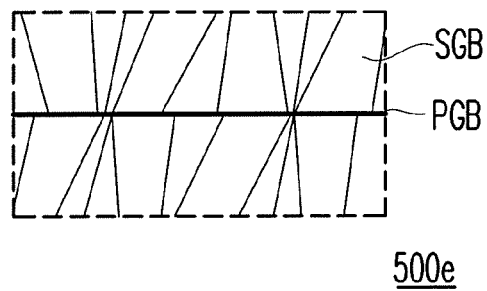
FIG. 9A          FIG. 9B

MASK AND METHOD OF FABRICATING A POLYSILICON LAYER USING THE SAME

CROSS-REFERENCE TO RELATED APPLICATION

This application claims the priority benefit of Taiwanese application serial no. 97125978, filed on Jul. 9, 2008. The entirety of the above-mentioned patent application is hereby incorporated by reference herein and made a part of this specification.

BACKGROUND OF THE INVENTION

1. Field of the Invention

The present invention relates to a mask, and more particularly, to a mask used for fabricating a polysilicon layer.

2. Description of Related Art

Generally speaking, electronic devices require switches for driving the devices. For instance, an active display device is often driven by a thin film transistor (TFT) acting as the switch. The TFTs can be classified into amorphous silicon TFTs and low-temperature polysilicon TFTs (LTPS-TFTs) based on materials of channel regions of the TFTs. By virtue of relatively low power consumption and great electron mobility in comparison with the amorphous silicon TFTs, the LTPS-TFTs have drawn more attention in the industry. Hence, low-temperature polysilicon crystallization technologies are extensively developed, wherein a sequential lateral solidification (SLS) laser crystallization technology is the mainstream of the crystallization technologies.

FIG. 1 is a schematic view of a conventional SLS laser crystallization apparatus 100. Referring to FIG. 1, the SLS laser crystallization apparatus 100 includes a laser light source (not shown), an optical system 110, and a substrate carrier 120. A substrate 130 on which an amorphous silicon layer (e.g., α-Si depicted in FIG. 1) is formed is placed on the substrate carrier 120. The substrate 130 is often laterally shifted by the substrate carrier 120 at a distance on a scale of millimeters. First, a laser beam 140 passing through a mask 112 is patterned, and the laser beam 140 irradiates the amorphous silicon layer on the substrate 130 through a projection lens 114 with a zoom-in ratio, a zoom-out ratio, or a proportional zoom ratio. Slits of the mask 112 restrict regions irradiated by the laser beam 140. Therefore, the amorphous silicon layer irradiated by the laser beam 140 is transformed to be silicon which is "melted state", while the non-irradiated amorphous silicon layer remains solid state. The melted silicon is laterally grown with use of the amorphous silicon layer as a nucleus, such that the amorphous silicon layer in the irradiated region becomes a polysilicon layer (e.g. p-Si depicted in FIG. 1). Next, with a stepping movement of the substrate 130, the entire amorphous silicon layer is transformed into the polysilicon layer having a periodic grain arrangement by sequential lateral crystallization. Patterns of the mask 112 control the position of a grain boundary and the region where a lateral crystallization occurs, and the grain size and the crystallization quality of the polysilicon layer significantly rely on the patterns of the mask 112.

FIG. 2A illustrates a mask used in a conventional SLS laser crystallization apparatus. FIG. 2B is a schematic partial view of a polysilicon layer formed by performing the SLS laser crystallization technology with use of the mask depicted in FIG. 2A. Referring to FIGS. 2A and 2B, a mask 200 has an opaque pattern 210 for defining a plurality of strip transparent slits 220 without any pattern therein. The transparent slits 220 are arranged in array, and the transparent slits 220 arranged in even columns and the transparent slits 220 arranged in odd columns are alternately arranged and partially overlapped to one another in a row direction. A polysilicon layer 250 formed by performing the SLS laser crystallization technology with use of the mask 200 has a plurality of primary grain boundaries (PGBs) and a plurality of secondary gain boundaries (SGBs) perpendicular to the PGBs. Here, the PGBs are also referred to as main grain boundaries, while the SGBs are also referred to as sub-grain boundaries. The number of the SGBs is inversely proportional to the carrier mobility of the polysilicon layer 250. Hence, when a direction of a current passing through a channel region of a polysilicon TFT is perpendicular to the PGBs but parallel to the SGBs, the carrier mobility of the polysilicon TFT is relatively high. However, when the polysilicon layer is patterned to form the channel regions of the TFTs, electrical properties of various polysilicon TFTs are quite different, given that length directions of the channel regions in the different TFTs and the PGBs together form included angles that are not exactly the same.

SUMMARY OF THE INVENTION

The present invention is directed to a mask including a primary opaque pattern and a plurality of clusters of secondary opaque patterns.

The present invention is further directed to a method of fabricating a polysilicon layer is adapted to equalize electrical properties of TFTs in which the polysilicon layer acts as channel regions. Besides, the method of fabricating the polysilicon layer can be applied to a method for fabricating an electronic apparatus.

The present invention provides a mask including a primary opaque pattern and a plurality of clusters of secondary opaque patterns. The primary opaque pattern defines a plurality of strip transparent slits whose extending directions are substantially the same. The clusters of the secondary opaque patterns are connected to the primary opaque pattern, and each of the clusters of the secondary opaque patterns is disposed in one of the transparent slits, respectively. Each of the clusters of the secondary opaque patterns includes a plurality of secondary opaque patterns, and extending directions of at least a portion of the secondary opaque patterns and the extending directions of the transparent slits together form included angles that are not equal to about 90°.

The present invention further provides a method of fabricating a polysilicon layer. First, an amorphous silicon layer is formed on a substrate. Next, a mask including a primary opaque pattern and a plurality of clusters of secondary opaque patterns is provided. The primary opaque pattern defines a plurality of strip transparent slits whose extending directions are substantially the same. The clusters of the secondary opaque patterns are connected to the primary opaque pattern, and each of the clusters of the secondary opaque patterns is disposed in one of the transparent slits, respectively. Each of the clusters of the secondary opaque patterns includes a plurality of secondary opaque patterns, and extending directions of at least a portion of the secondary opaque patterns and the extending directions of the transparent slits together form included angles that are not equal to about 90°. Thereafter, a laser beam is provided to irradiate the substrate through the mask.

In the present invention, the mask includes the plurality of clusters of the secondary opaque patterns, and the extending directions of the at least a portion of the secondary opaque patterns and the extending directions of the transparent slits together form the included angles that are not equal to about 90°. Hence, in the polysilicon layer formed by using the mask, the included angles between at least a portion of the SGBs and the PGBs are not equal to about 90°. Thereby, when the polysilicon layer is patterned to form the channel regions of the TFTs, although the included angles between the length directions of the channel regions in different TFTs and the PGBs are not exactly the same, the polysilicon TFTs can be equipped with consistent electrical properties.

In order to make the above and other objects, features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 5A through 9A are schematic views of a cluster of secondary opaque patterns in a mask according to an embodiment of the present invention, and FIGS. 5B through 9B are schematic partial views of a polysilicon layer formed by laser irradiation with use of the mask depicted in FIGS. 5A through 9A.

DESCRIPTION OF EMBODIMENTS

Figure 3:
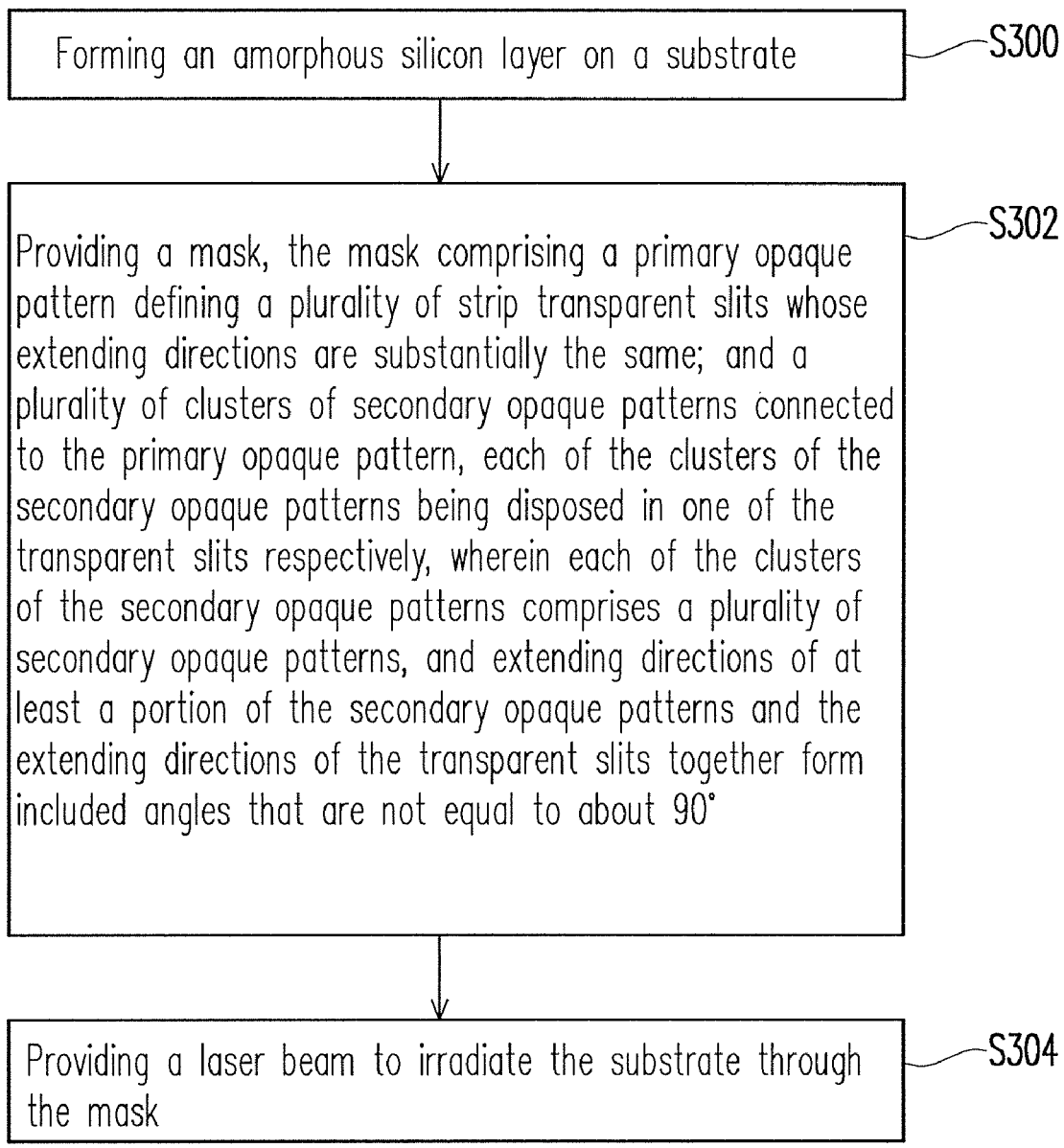
FIG. 3 is a schematic flowchart illustrating a method of fabricating a polysilicon layer according to an embodiment of the present invention.

FIG. 3 is a schematic flowchart illustrating a method of fabricating a polysilicon layer according to an embodiment of the present invention.

Figure 1:
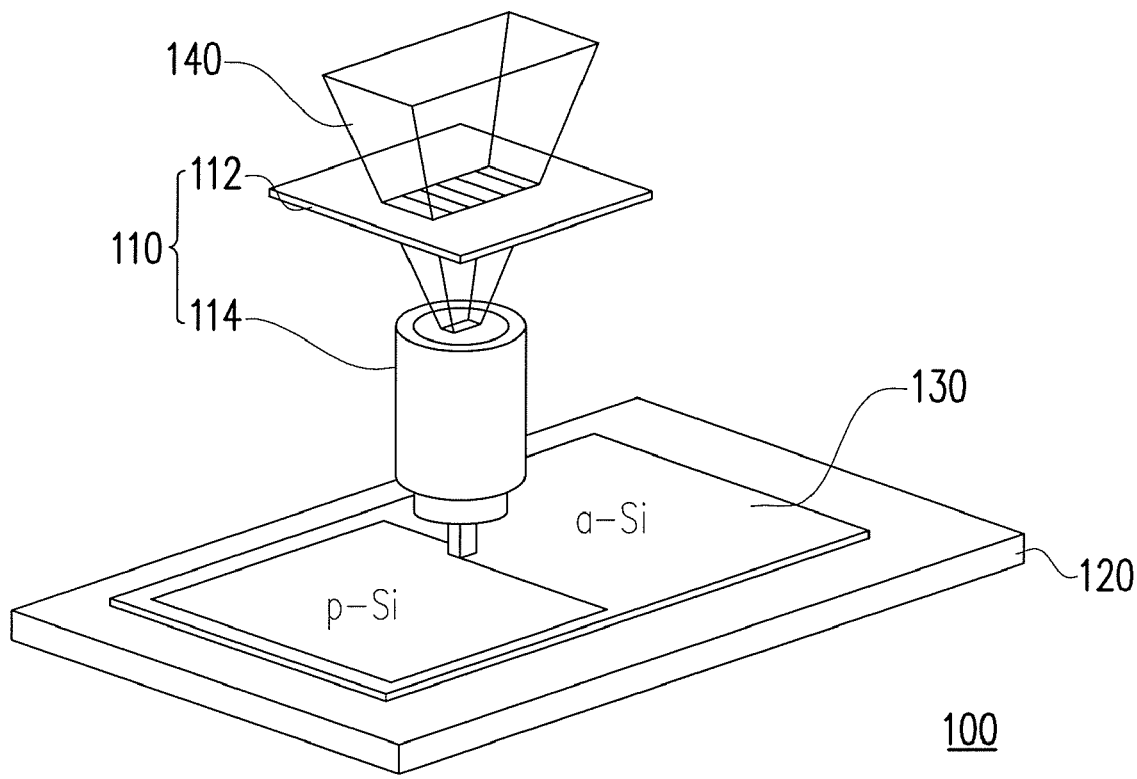
FIG. 1 is a schematic view of a conventional SLS laser crystallization apparatus.
Figure 2A:
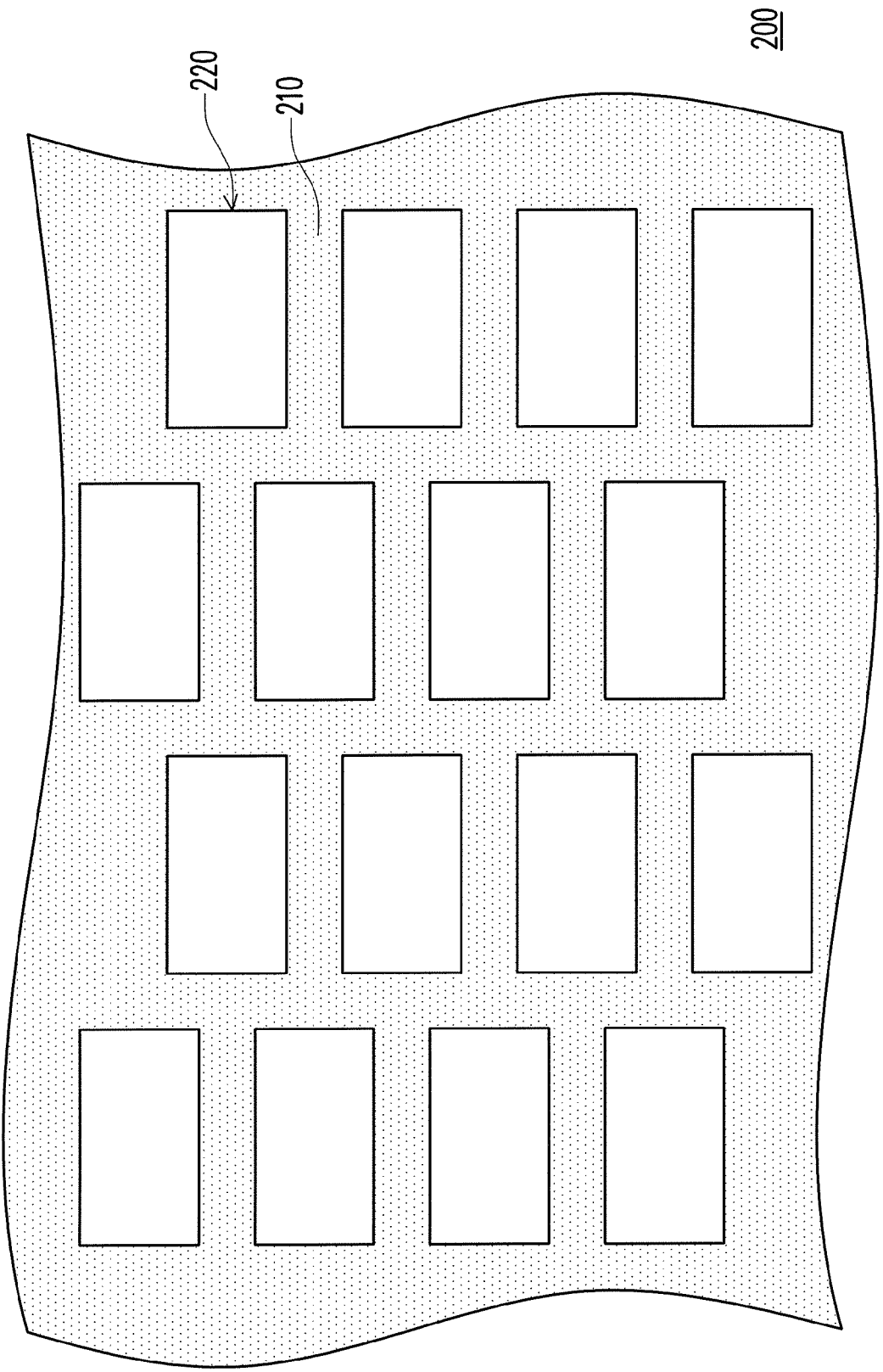
FIG. 2A illustrates a mask used in a conventional SLS laser crystallization apparatus.
Figure 2B:
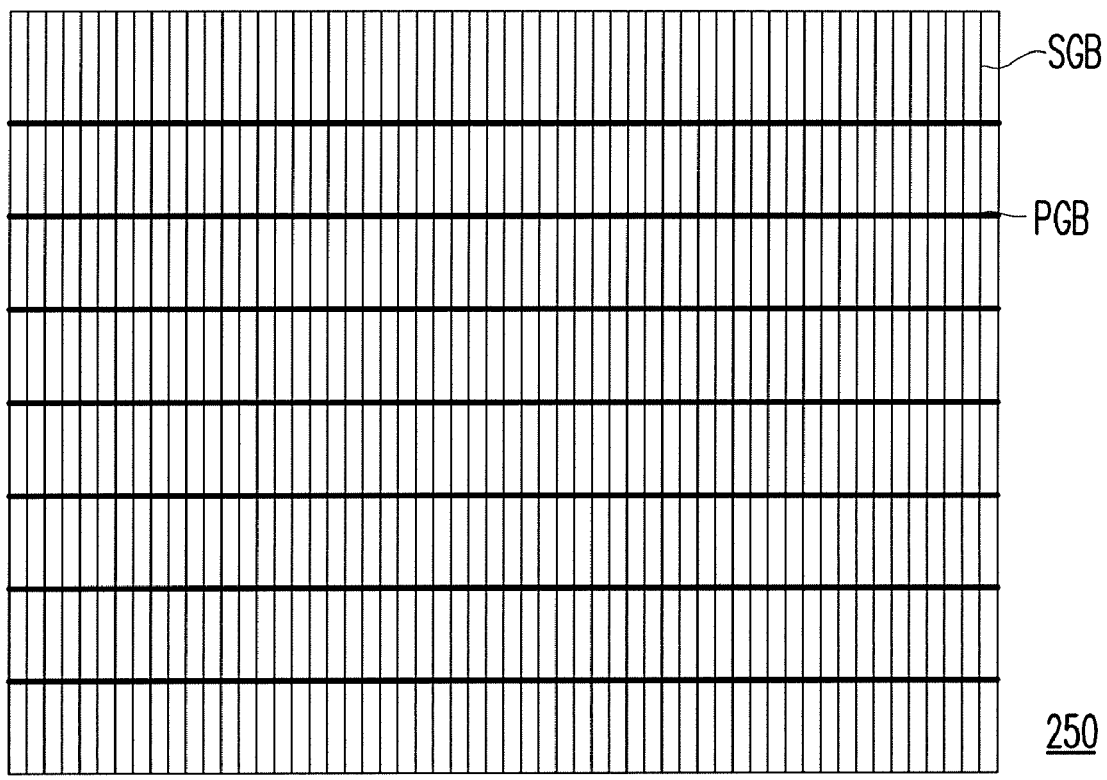
FIG. 2B is a schematic partial view of a polysilicon layer formed by performing the SLS laser crystallization technology with use of the mask depicted in FIG. 2A.

Referring to FIG. 3, in step S300, an amorphous silicon layer is first formed on a substrate. Next, for example, the substrate having the amorphous silicon layer is placed on a substrate carrier 120 in an SLS laser crystallization apparatus depicted in FIG. 1. The substrate is, for example, made of an inorganic transparent material (e.g., glass, quartz, other appropriate materials, or a combination thereof), an organic transparent material (e.g., polyolefin, polythiourea, polyalcohols, polyester, rubber, a thermoplastic polymer, a thermosetting polymer, polyarylene, polymethylmethacrylate, plastic, polycarbonate, other appropriate materials, derivatives thereof, or a combination thereof), or a combination thereof. According to the present embodiment, the substrate is made of glass, which is however not limited in the present invention. The amorphous silicon layer is formed by performing a chemical vapor deposition (CVD) process, an inkjet process, a coating process, an atomic layer deposition (ALD) process, or other appropriate processes, for example.

Figure 4A:
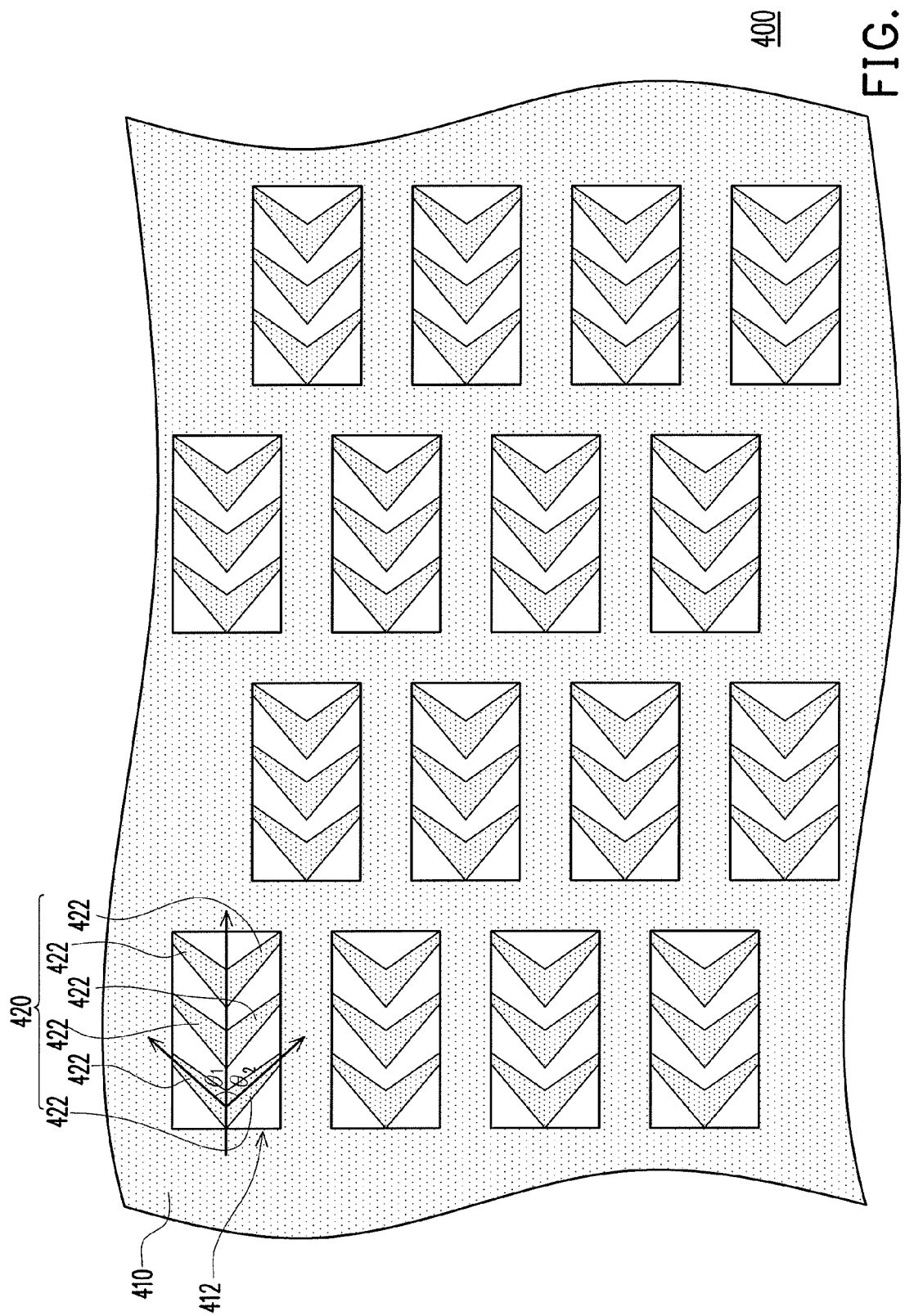
FIG. 4A is a schematic view of a mask according to an embodiment of the present invention.
Figure 4B:
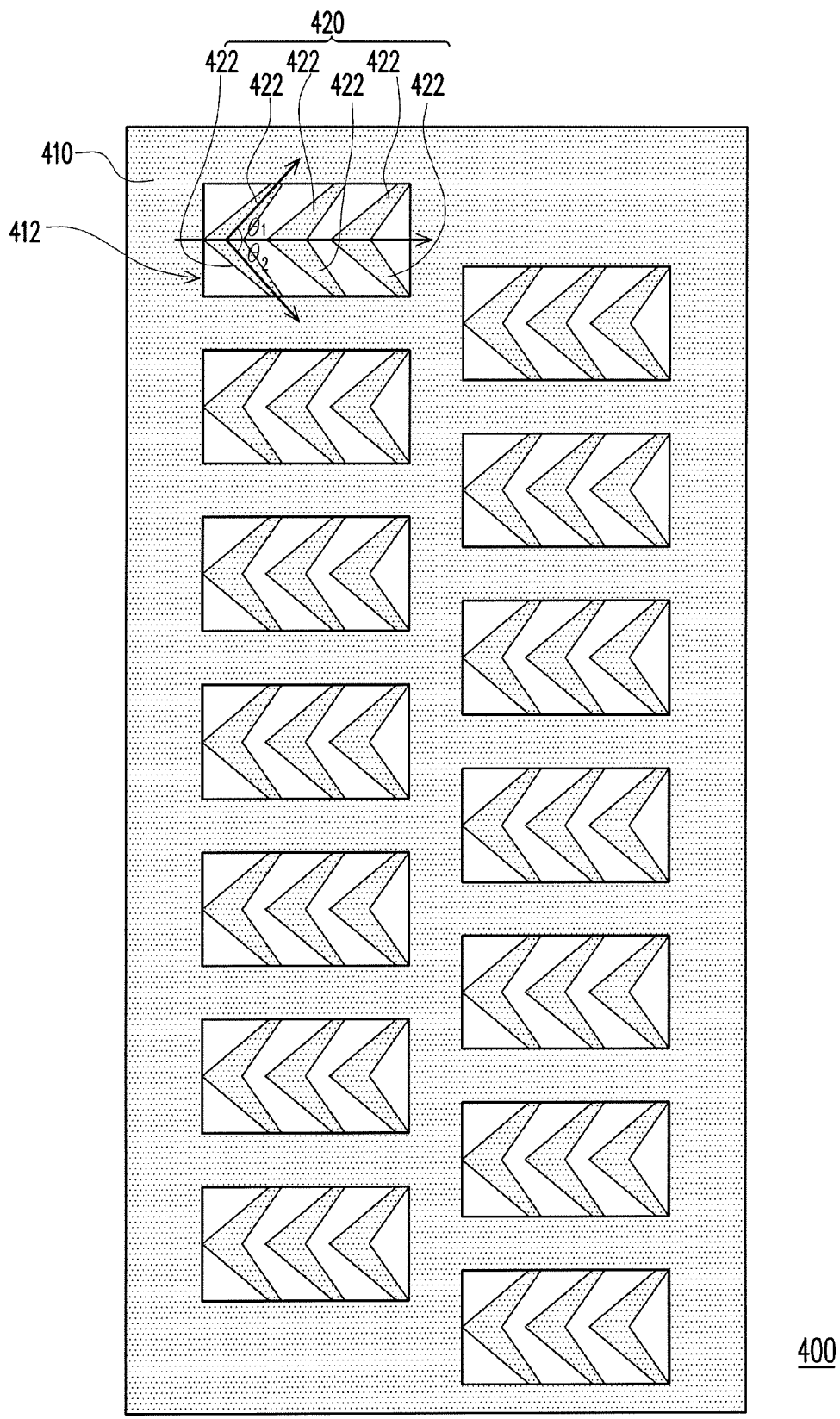
FIG. 4B is a schematic view of a mask according to an embodiment of the present invention.

FIG. 4A is a schematic view of a mask according to an embodiment of the present invention. Referring to FIGS. 3 and 4A, in step S302, a mask 400 is, for example, provided in the SLS laser crystallization apparatus. The mask 400 includes a primary opaque pattern 410 and a plurality of clusters of secondary opaque patterns 420. The primary opaque pattern 410 defines a plurality of strip transparent slits 412 whose extending directions are substantially the same. The clusters of the secondary opaque patterns 420 are connected to the primary opaque pattern 410, and each of the clusters of the secondary opaque patterns 420 is disposed in one of the transparent slits 412, respectively. Each of the clusters of the secondary opaque patterns 420 includes a plurality of secondary opaque patterns 422, and extending directions of at least a portion of the secondary opaque patterns 422 and the extending directions of the transparent slits 412 together form included angles θ1 and θ2 that are not equal to about 90°. It should be mentioned that the plurality of clusters of the secondary opaque patterns 420 depicted in FIG. 4A are arranged in four columns or in four rows, which is however not limited in the present invention. For instance, as shown in FIG. 4B, the plurality of clusters of the secondary opaque patterns 420 can be arranged in two columns. Namely, the plurality of clusters of the secondary opaque patterns 420 can be arranged in N columns or in M rows, wherein at least one of N and M is greater than or equal to 2.

Referring to FIG. 4A, in the present embodiment, the transparent slits 412 are arranged in array. The transparent slits 412 arranged in even columns are substantially aligned to one another in a row direction, the transparent slits 412 arranged in odd columns are substantially aligned to one another in the row direction, and the transparent slits 412 arranged in the even columns and the transparent slits 412 arranged in the odd columns are substantial alternately arranged in the row direction. Note that the transparent slits 412 arranged in the even columns and the transparent slits 412 arranged in the odd columns are not completely arranged in an alternate manner in the row direction. In other words, given that the transparent slits 412 arranged in the even columns are laterally shifted to the positions of the transparent slits 412 arranged in the odd columns, it can be observed that the transparent slits 412 arranged in the even columns and the transparent slits 412 arranged in the odd columns are partially overlapped. A width of each of the transparent slits 412 ranges from about 5 μm to about 100 μm, for example, while the width of each of the transparent slits 412 should not be construed as limited to the present embodiment. In other embodiments, the transparent slits 412 arranged in the even columns and the transparent slits 412 arranged in the odd columns can be substantially aligned to one another in the row direction.

Moreover, in the present embodiment, each of the clusters of the secondary opaque patterns 420 can include six, more than six, or less than six secondary opaque patterns 422. The secondary opaque patterns 422 have a strip shape in the present embodiment, which is however not limited in the present invention. Besides, a width of each of the secondary opaque patterns 422 is varied upon different horizontal positions of the secondary opaque patterns 422. As such, the width of each of the secondary opaque patterns 422 ranges from about 0.1 μm to about 10 μm, for example, while the width of each of the secondary opaque patterns 422 should not be construed as limited to the present embodiment. Here, the secondary opaque patterns 422 connected to one another are arranged in a shape similar to the letter V (hereinafter "the quasi-V shape"), and openings of the quasi-V-shaped secondary opaque patterns 422 face toward the same direction. The extending directions of the secondary opaque patterns 422 and the extending directions of the transparent slits 412 together form the included angles θ1 and θ2 that are about 45°, for example, which is however not limited in the present invention. Note that the extending directions of the secondary opaque patterns 422 positioned within the same transparent slit 412 are not exactly the same, for example. Further, in other embodiments, the included angles θ1 and θ2 between the extending directions of the secondary opaque patterns 422 and the extending directions of the transparent slits 412 can be substantially the same or different. In an alternative, the included angles θ1 and θ2 can also have other values instead of 45°.

Figure 4C:
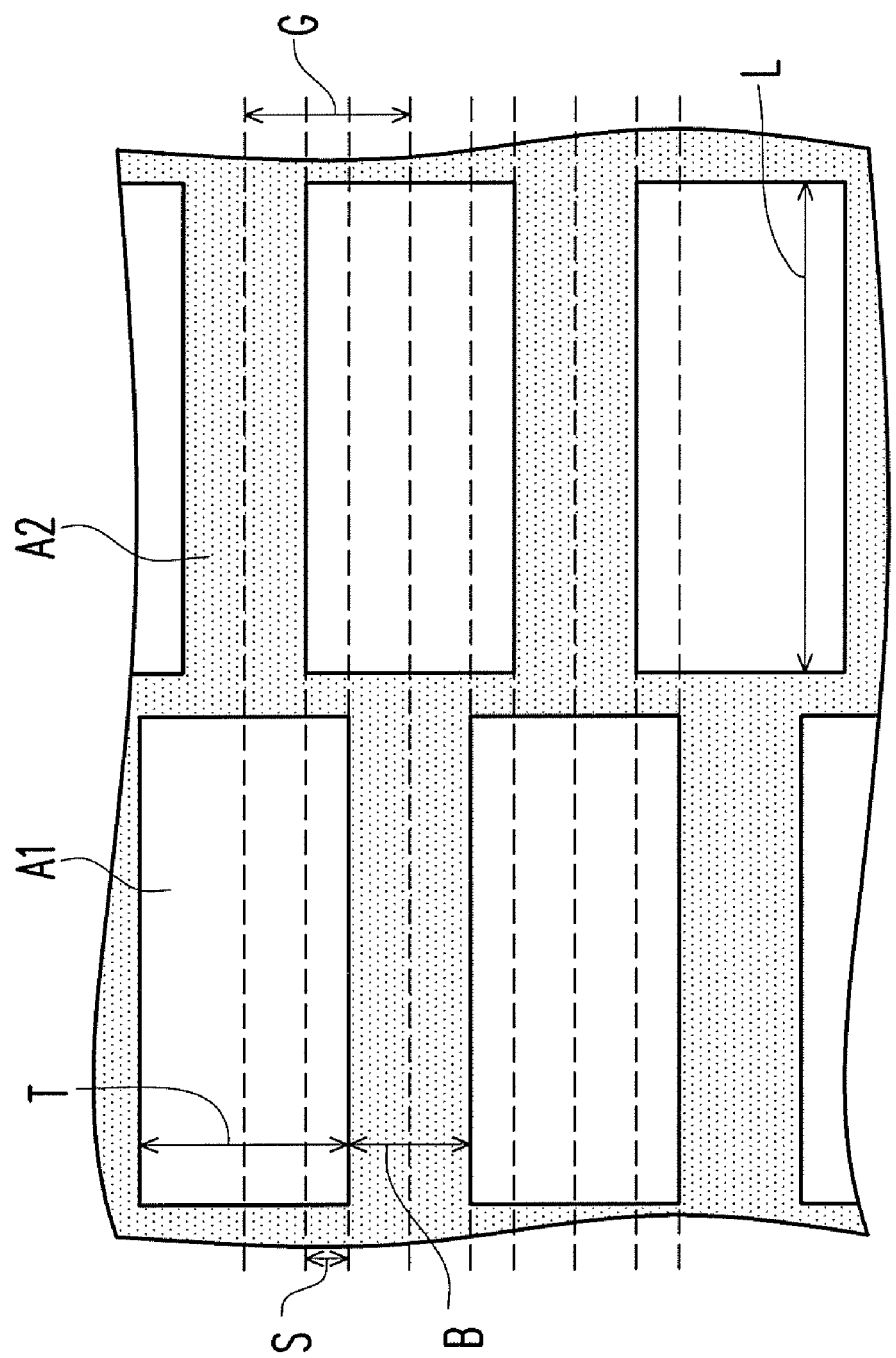
FIG. 4C is a schematic partial view of an amorphous silicon layer irradiated by a laser beam with use of the mask depicted in FIG. 4A.
Figure 4D:
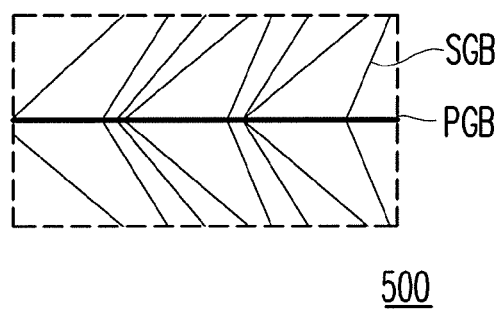
FIG. 4D is a schematic partial view of a polysilicon layer irradiated by a laser beam with use of the mask depicted in FIG. 4A.

Referring to FIGS. 3, 4C, and 4D. FIG. 4C is a schematic partial view of an amorphous silicon layer irradiated by a laser beam with use of the mask depicted in FIG. 4A. FIG. 4D is a schematic partial view of a polysilicon layer irradiated by a laser beam with use of the mask depicted in FIG. 4A. In step S304, a laser beam is provided to irradiate the substrate through the mask 400, such that an amorphous silicon layer 440 is transformed into a polysilicon layer 500 by performing the SLS laser crystallization technology. In detail, the laser beam irradiates the amorphous silicon layer 440 through the mask 400. A first region A1 irradiated by the laser beam passing through the transparent slits 412 is the "melted state" silicon, while a second region A2 that is shielded by the primary opaque pattern 410 and is not irradiated by the laser beam is solid state amorphous silicon. Here, a width T of the first region A1 is, for example, greater than about 1.5 μm, preferably ranging from about 4.5 μm to about 6 μm. A length L of the first region A1 is varied upon the dimension of the mask 400. In the present embodiment, a distance B between the first regions A1 in the same column is, for example, greater than or equal to about 1.5 μm. An overlapping width S between the adjacent first regions A1 disposed in different columns is, for example, greater than or equal to about 1.5 μm, preferably about 2 μm. The correlation of the width T, the distance B, and the overlapping width S is, for example, represented as B=T−2S. Hence, at least one of the width of a portion of the transparent slits 412 (which can be referred to as an opening not shown in the drawings) disposed between adjacent secondary opaque patterns 422 and the width of a portion of the transparent slits 412 (which can also be referred to as an opening not shown in the drawings) disposed between the secondary opaque pattern 422 and the primary opaque pattern 410 is substantially less than an optical resolution of the optical system 110 in the SLS laser crystallization apparatus 100 indicated in FIG. 1, preferably. Namely, favorable polysilicon crystallization can be achieved when one of said widths is less than said optical resolution, about 1.5 μm, for example. However, it should be mentioned that the optical resolution parameter can be disregarded given that the number of the secondary opaque patterns 422 is appropriately defined. Additionally, the shape of a portion of the transparent slits 412 (which can be referred to as an opening not shown in the drawings) disposed between adjacent secondary opaque patterns 422 and the shape of a portion of the transparent slits 412 (which can also be referred to as an opening not shown in the drawings) disposed between the secondary opaque pattern 422 and the primary opaque pattern 410 are not limited in the present invention. As such, the optical resolution parameter and the shapes of the openings can be applied or not applied to the mask design shown in the following figures. However, the optical resolution of the optical system 110 in the SLS laser crystallization apparatus 100 is varied upon different types of machines, which is not limited in the present invention.

Referring to FIGS. 4A, 4C, and 4D, in the mask 400, the transparent slits 412 arranged in the even columns and the transparent slits 412 arranged in the odd columns are not completely arranged in an alternate manner. Therefore, with the stepping movement of the mask 400, the amorphous silicon layer 440 is gradually transformed into the polysilicon layer 500, and grains of the polysilicon layer 500 have a grain size G as indicated in FIG. 4C. Besides, the shape and the arrangement of the secondary opaque patterns 422 in the mask 400 result in that the growth direction of the grains of the polysilicon layer 500 and the PGBs together form an included angle that is not equal to about 90°. Namely, the included angles between the PGBs and the SGBs of the polysilicon layer 500 are not equal to about 90°. Thereby, when the polysilicon layer 500 is patterned to form the channel regions of the TFTs, although the included angles between the length directions of the channel regions in different TFTs and the PGBs are not exactly the same, the polysilicon TFTs can be equipped with consistent electrical properties. In addition, according to the present embodiment, the secondary opaque patterns 422 in the mask 400 have projection dimensions on the amorphous silicon layer 440. Said projection dimensions are 0.2 times the original dimensions of the secondary opaque patterns 422, which is however not limited in the present invention. That is to say, in other embodiments, according to the required size of the grains in the polysilicon, said projection dimensions of the secondary opaque patterns 422 in the mask 400 can be enlarged, reduced, or adjusted in proportional to the original dimensions of the secondary opaque patterns 422. In an alternative, a combination of any two of the enlargement, the reduction, and the proportional adjustment would suffice.

In the aforesaid embodiment, the structure of the mask 400 is exemplified in FIG. 4A, which is however not limited in the present invention. The secondary opaque patterns in the mask can also be the patterns respectively shown in FIGS. 5A through 9A, which is elaborated hereinafter. Besides, any of the secondary opaque patterns 422, 422a, 422b, 422c, 422d, and 422e depicted in FIGS. 4A through 9A can be applied to the same cluster of the secondary opaque patterns.

FIGS. 5A through 9A are schematic views of a cluster of secondary opaque patterns in a mask according to an embodiment of the present invention, and FIGS. 5B through 9B are schematic partial views of a polysilicon layer formed by laser irradiation with use of the mask depicted in FIGS. 5A through 9A.

Figures 5A, 5B:
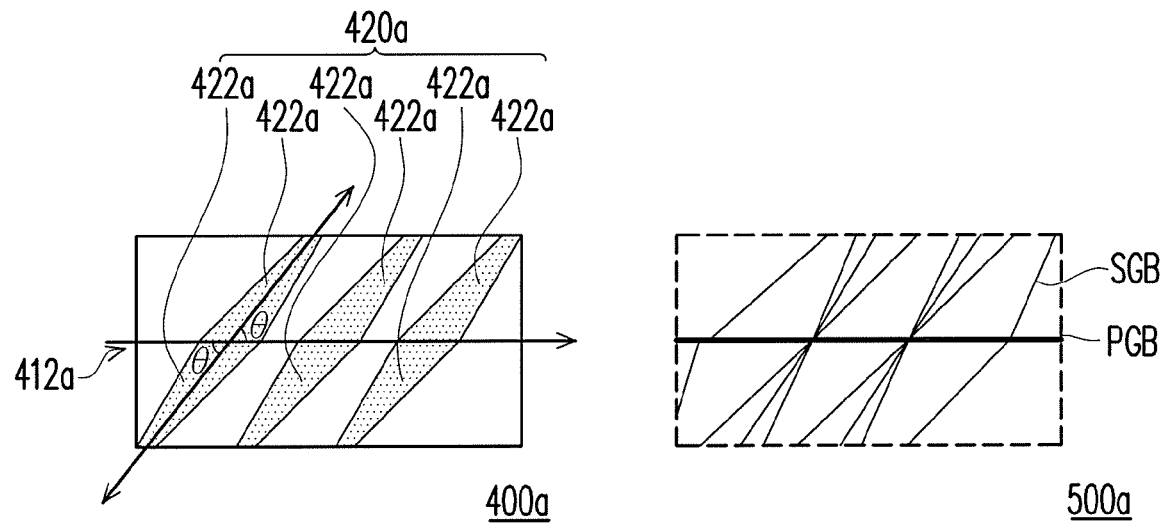

Referring to FIGS. 5A and 5B, in the present embodiment, the secondary opaque patterns 422a are similar to the secondary opaque patterns 422 depicted in FIG. 4A. Nevertheless, the secondary opaque patterns 422a connected to one another in the present embodiment are arranged in a shape similar to a parallelogram. Each extending direction of the secondary opaque patterns 422a and each extending direction of transparent slits 412a together form an included angle θ that is about 45°, for example. However, the value of the included angle θ is not limited in the present invention. Each of the PGBs and each of the SGBs of a polysilicon layer 500a formed by using a mask 400a in the present embodiment together form an included angle which is not equal to about 90°.

Referring to FIGS. 6A and 6B, in the present embodiment, the secondary opaque patterns 422b are similar to the secondary opaque patterns 422 depicted in FIG. 4A. Nevertheless, the secondary opaque patterns 422b connected to one another in the present embodiment are arranged in the quasi-V shape, and openings of the adjacent quasi-V-shaped secondary opaque patterns 422b face toward different directions. Each extending direction of the secondary opaque patterns 422b and each extending direction of transparent slits 412b together form an included angle θ that is about 45°, for example. However, the value of the included angle θ is not limited in the present invention. Each of the PGBs and each of the SGBs of a polysilicon layer 500b formed by using a mask 400b in the present embodiment together form an included angle which is not equal to about 90°.

Referring to FIGS. 7A and 7B, in the present embodiment, the secondary opaque patterns 422c are similar to the secondary opaque patterns 422 depicted in FIG. 4A. Nevertheless, the secondary opaque patterns 422c connected to one another in the present embodiment are in a point-symmetric arrangement. Each extending direction of the secondary opaque patterns 422c and each extending direction of transparent slits 412c together form an included angle θ that is about 45°, for example. However, the value of the included angle θ is not limited in the present invention. Each of the PGBs and each of the SGBs of a polysilicon layer 500c formed by using a mask 400c in the present embodiment together form an included angle which is not equal to about 90°.

Referring to FIGS. 8A and 8B, in the present embodiment, the secondary opaque patterns 422d have a strip shape and a fixed width that should not be construed as limited to the present embodiment. That is to say, in other embodiments, the width of the strip-shaped secondary opaque patterns 422d can be gradually wide, gradually narrow, partially wide, partially narrow, or a combination thereof. Here, each extending direction of a portion of the secondary opaque patterns 422d and each extending direction of transparent slits 412d together form an included angle θ' that is equal to about 90°, while each extending direction of at least another portion of the secondary opaque patterns 422d and each extending direction of the transparent slits 412d together form an included angle θ that is not equal to about 90° (e.g., 45°), which is however not limited in the present invention. Note that a portion of the SGBs and a portion of the PGBs of a polysilicon layer 500d formed by using a mask 400d in the present embodiment together form an included angle which is equal to about 90°, while at least another portion of the PGBs and at least another portion of the SGBs together form an included angle which is not equal to about 90°.

Referring to FIGS. 9A and 9B, in the present embodiment, the secondary opaque patterns 422e are similar to the secondary opaque patterns 422d depicted in FIG. 8A. Here, each extending direction of a portion of the secondary opaque patterns 422e and each extending direction of transparent slits 412e together form an included angle θ' that is equal to about 90°, while each extending direction of at least another portion of the secondary opaque patterns 422e and each extending direction of the transparent slits 412e together form an included angle θ that is not equal to about 90° (e.g., 45°), which is however not limited in the present invention. Besides, in the present embodiment, a portion of the secondary opaque patterns 422e has a strip shape and a fixed width that should not be construed as limited to the present embodiment. That is to say, in other embodiments, the width of the strip-shaped secondary opaque patterns 422e can be gradually wide, gradually narrow, partially wide, partially narrow, or a combination thereof. Note that a portion of the SGBs and a portion of the PGBs of a polysilicon layer 500e formed by using a mask 400e in the present embodiment together form an included angle which is equal to about 90°, while at least another portion of the PGBs and at least another portion of the SGBs together form an included angle which is not equal to about 90°.

It should be mentioned that the included angles between the extending directions of the secondary opaque patterns and the extending directions of the transparent slits are either about 45° or about 90° in the previous embodiments, while the values of the included angles should not be construed as limited to the previous embodiments. Namely, the included angles between the extending directions of the secondary opaque patterns and the extending directions of the transparent slits can have other values. Moreover, during the fabrication of the polysilicon layer, the amorphous silicon layer in different regions can be irradiated by the laser beam with use of a number of masks having different secondary opaque patterns or with use of the masks mentioned together with the conventional masks, such that the polysilicon layer formed thereby can have different grain orientations in different regions.

In the aforesaid embodiments, the mask includes the plurality of clusters of the secondary opaque patterns, and the extending directions of the at least a portion of the secondary opaque patterns and the extending directions of the transparent slits together form the included angles that are not equal to about 90°. Hence, in the polysilicon layer formed by performing the laser irradiation thereon with use of the mask, the included angles between at least a portion of the SGBs and the PGBs are not equal to about 90°. Thereby, when the polysilicon layer is patterned to form the channel regions of the TFTs, although the included angles between the length directions of the channel regions in different TFTs and the PGBs are not exactly the same, the polysilicon TFTs can be equipped with consistent electrical properties. As such, the display devices using said polysilicon TFTs have great electrical properties. The TFTs fabricated by referring to the aforesaid embodiments of the present invention can be applied to various self-illuminating or non-self-illuminating display panels and electronic apparatuses. Besides, the methods for fabricating the self-illuminating or non-self-illuminating display panels and electronic apparatuses also include steps of fabricating the TFTs in light of the aforesaid embodiments of the present invention. Here, the electronic apparatus further includes at least one electronic device electrically connected to the display panel. The electronic device is, for example, a control device, an operation device, a treatment device, an input device, a memory device, a driving device, a light emitting device, a protection device, a sensing device, a detecting device, other devices having other functions, or a combination thereof. On the other hand, the electronic apparatus comprises a portable product (e.g., a mobile phone, a camcorder, a camera, a notebook computer, a game player, a watch, a music player, an e-mail receiver and sender, a map navigator, a digital picture, or the like), an audio-video product (e.g., an audio-video player or the like), a screen, a television, an outdoor/indoor bulletin, a panel in a projector, and so on. In addition, the TFT formed by referring to the aforesaid embodiments of the present invention is equipped with functions of driving, switching, signal conversion, detection, sensing, light energy transformation, touch-control, reading, or other appropriate functions.

Although the present invention has been disclosed above by the embodiments, they are not intended to limit the present invention. Anybody skilled in the art can make some modifications and alterations without departing from the spirit and scope of the present invention. Therefore, the protecting range of the present invention falls in the appended claims.

What is claimed is:

1. A mask, comprising:
   a primary opaque pattern being adapted to define a plurality of strip transparent slits whose extending directions are substantially the same; and
   a plurality of clusters of secondary opaque patterns, connected to the primary opaque pattern, each of the clusters of the secondary opaque patterns being disposed in one of the transparent slits respectively, wherein each of the clusters of the secondary opaque patterns comprises a plurality of secondary opaque patterns, and extending directions of at least a portion of the secondary opaque patterns and the extending directions of the transparent slits together form included angles that are not equal to about 90°.

2. The mask of claim 1, wherein the transparent slits are arranged in array, the transparent slits arranged in even columns are substantially aligned to one another in a row direction, the transparent slits arranged in odd columns are substantially aligned to one another in the row direction, and the transparent slits arranged in the even columns and the transparent slits arranged in the odd columns are substantial alternately arranged in the row direction.

3. The mask of claim 1, wherein a width of each of the transparent slits ranges from about 5 μm to about 100 μm.

4. The mask of claim 1, wherein a width of each of the secondary opaque patterns ranges from about 0.1 μm to about 10 μm.

5. The mask of claim 1, wherein the extending directions of the at least a portion of the secondary opaque patterns and the extending directions of the transparent slits together form the included angles that are about 45°.

6. The mask of claim 1, wherein the extending directions of the secondary opaque patterns disposed within the same transparent slit are not exactly the same.

7. A method of fabricating a polysilicon layer, comprising:
   forming an amorphous silicon layer on a substrate;
   providing a mask, the mask comprising:
      a primary opaque pattern being adapted to define a plurality of strip transparent slits whose extending directions are substantially the same; and
      a plurality of clusters of secondary opaque patterns, connected to the primary opaque pattern, each of the clusters of the secondary opaque patterns being disposed in one of the transparent slits respectively, wherein each of the clusters of the secondary opaque patterns comprises a plurality of secondary opaque patterns, and extending directions of at least a portion of the secondary opaque patterns and the extending directions of the transparent slits together form included angles that are not equal to about 90°; and
   providing a laser beam to irradiate the substrate through the mask.

8. The fabricating method of claim 7, wherein the transparent slits are arranged in array, the transparent slits arranged in even columns are substantially aligned to one another in a row direction, the transparent slits arranged in odd columns are substantially aligned to one another in the row direction, and the transparent slits arranged in the even columns and the transparent slits arranged in the odd columns are substantial alternately arranged in the row direction.

9. The method of claim 7, wherein a width of each of the transparent slits ranges from about 5 μm to about 100 μm.

10. The method of claim 7, wherein a width of each of the secondary opaque patterns ranges from about 0.1 μm to about 10 μm.

11. The method of claim 7, wherein the extending directions of the at least a portion of the secondary opaque patterns and the extending directions of the transparent slits together form the included angles that are about 45°.

12. The method of claim 7, wherein the extending directions of the secondary opaque patterns disposed within the same transparent slit are not exactly the same.

13. A method of fabricating an electronic apparatus, comprising the method of fabricating the polysilicon layer of claim 7.

* * * * *